United States Patent
Ishiguro et al.

(10) Patent No.: US 8,878,248 B2
(45) Date of Patent: Nov. 4, 2014

(54) SEMICONDUCTOR DEVICE AND FABRICATION METHOD

(75) Inventors: Tetsuro Ishiguro, Kawasaki (JP); Atsushi Yamada, Isehara (JP)

(73) Assignee: Transphorm Japan, Inc., Yokoham (JP)

( * ) Notice: Subject to any disclaimer, the term of this patent is extended or adjusted under 35 U.S.C. 154(b) by 165 days.

(21) Appl. No.: 13/544,023

(22) Filed: Jul. 9, 2012

(65) Prior Publication Data

US 2013/0075785 A1  Mar. 28, 2013

(30) Foreign Application Priority Data

Sep. 28, 2011 (JP) ................................ 2011-213472

(51) Int. Cl.
| | | |
|---|---|---|
| *H01L 31/0328* | (2006.01) | |
| *H01L 31/0336* | (2006.01) | |
| *H01L 31/072* | (2012.01) | |
| *H01L 31/109* | (2006.01) | |
| *H01L 29/778* | (2006.01) | |
| *H01L 29/66* | (2006.01) | |
| *H01L 29/10* | (2006.01) | |
| *H01L 29/20* | (2006.01) | |

(52) U.S. Cl.
CPC ...... *H01L 29/7787* (2013.01); *H01L 29/66462* (2013.01); *H01L 29/1029* (2013.01); *H01L 29/2003* (2013.01)
USPC ........................... 257/194; 257/192; 257/196

(58) Field of Classification Search
USPC ......................................... 257/194, 192, 196
See application file for complete search history.

(56) References Cited

U.S. PATENT DOCUMENTS

| | | | |
|---|---|---|---|
| 2006/0214193 A1* | 9/2006 | Hayamura et al. | 257/213 |
| 2009/0050938 A1* | 2/2009 | Miyoshi et al. | 257/194 |
| 2011/0227093 A1 | 9/2011 | Hikita | |

FOREIGN PATENT DOCUMENTS

| | | |
|---|---|---|
| JP | 2002-359256 A1 | 12/2002 |
| JP | 2010-135641 A1 | 6/2010 |

OTHER PUBLICATIONS

S. Heikman, et al.; "Growth and characteristics of Fe-doped GaN;" Journal of Crystal Growth; vol. 248; pp. 513-517; 2003/ p. 4 of specification.

* cited by examiner

*Primary Examiner* — Thien F Tran
(74) *Attorney, Agent, or Firm* — Fish & Richardson P.C.

(57) ABSTRACT

A semiconductor device includes a first semiconductor layer formed on a substrate, the first semiconductor containing an impurity element; a second semiconductor layer formed on the first semiconductor layer; a third semiconductor layer formed on the second semiconductor layer; and a gate electrode, a source electrode and a drain electrode that are formed on the third semiconductor layer. In the semiconductor device, the second semiconductor layer includes an impurity diffusion region in which an impurity element contained in the first semiconductor layer is diffused, the impurity diffusion region being located directly beneath the gate electrode and being in contact with the first semiconductor layer, and the impurity element causes the impurity diffusion region to be a p-type impurity diffusion region.

5 Claims, 12 Drawing Sheets

SEMICONDUCTOR DEVICE AND FABRICATION METHOD

CROSS-REFERENCE TO RELATED APPLICATION

This patent application is based upon, and claims the benefit of priority of Japanese Patent Application No. 2011-213472 filed on Sep. 28, 2011, the entire contents of which are incorporated herein by reference.

FIELD

The embodiments discussed herein relate to a semiconductor device and a fabrication method thereof.

BACKGROUND

A nitride semiconductor such as gallium nitride (GaN), aluminum nitride (AlN), and indium nitride (InN), or a material composed of a mixed crystal of GaN, AlN and InN generally has a wide band gap. These materials are utilized as a high-power electronic device, a short-wavelength light emitting device or the like. Among these, a technology associated with a field-effect transistor (FET), specifically, with a high electron mobility transistor (HEMT) has been developed as a high-power device (e.g., Patent Document 1). A high electron mobility transistor (HEMT) including a nitride semiconductor may be utilized for a high-power and high-efficiency amplifier, a high-power switching device, and the like.

The HEMT having a nitride semiconductor generally includes an aluminum gallium nitride/gallium nitride (AlGaN/GaN) heterostructure formed on a substrate, in which a GaN layer serves as an electron transit layer. Note that the substrate may be formed of sapphire, silicon carbide (SiC), gallium nitride (GaN), silicon (Si), and the like.

The GaN, which is a kind of the nitride semiconductor, includes a high saturation electron velocity or a wide band gap. Hence, the GaN may be able to acquire superior pressure resistance and exhibit excellent electric characteristics. Since the crystal structure of the GaN is a hexagonal wurtzite structure, the GaN is polarized in a [0 0 0 1] direction parallel to a c-axis (wurtzite form). Further, when the AlGaN/GaN heterostructure is formed, piezoelectric polarization may be induced by lattice strain between the AlGaN and GaN. As a result, a highly-concentrated two-dimensional electron gas (2DEG) may be generated near an interface of the GaN layer serving as a channel. Hence, the high electron mobility transistor (HEMT) utilizing the GaN may be developed as a potential high-power device.

However, when the high electron mobility transistor (HEMT) utilizing the GaN is in an off status that is less than or equal to the pinch-off voltage, a current may pass through a lower part of the electron transit layer directly beneath the gate electrode so that the current may be leaked from the drain side to the source side. Specifically, as illustrated in FIG. 1, the HEMT having the GaN includes a buffer layer 912, an electron transit layer 913, and an electron donation layer 914 formed on a substrate 911. The HEMT further includes a gate electrode 921, a source electrode 922 and a drain electrode 923 on the electron donation layer 914. Note that the electron transit layer 913 is formed of GaN, the electron donation layer is formed of AlGaN. Hence, 2DEG 913a is formed near the interface between the electron transit layer 913 and the electron donation layer 914.

In general, the electron transit layer 913 is formed such that the electron transit layer 913 is sufficiently thick for securing crystallinity. However, when the electron transit layer 913 is thick, the electric field generated by the voltage applied to the gate electrode 921 may not reach a part or an area directly beneath the gate electrode 921, which may facilitate the generation of the leakage current in the lower part of the electron transit layer 913. That is, a depletion region 919 formed by the application of the gate voltage to the gate electrode 921 or the like may not reach the lower part of the electron transit layer 913, which may facilitate the generation of the leakage current in a direction indicated by an arrow in the lower part of the electron transit layer 913 illustrated in FIG. 1. When such a leakage current is increased in the HEMT having GaN that is utilized as a high-power amplifier, the amplification efficiency may be lowered.

Further, the HEMT having GaN is generally susceptible to being in a normally-on status due to the highly-concentrated two-dimensional electron gas (2DEG). Hence, the HEMT having GaN may not easily acquire a normally-off characteristic. Numerous semiconductor devices in the current power electronics market have a normally-off characteristic. Hence, it is highly preferable that the HEMT having GaN have a normally-off characteristic in view of compatibility between the HEMT having GaN and the semiconductor devices.

Accordingly, there are disclosed various methods for controlling the leakage current. For example, the leakage current may be controlled by thinning the electron transit layer 913 formed of GaN, or by doping impurity serving as an acceptor such as Mg or Fe to the lower part of the electron transit layer 913 so as to increase the resistance of the lower part of the electron transit layer 913 (e.g., Patent Document 1). Further, there is disclosed various methods for maintaining the normally-off status. For example, the normally-off status may be maintained by forming a Mg-doped low resistance p-type GaN layer between an electron donation layer and a gate electrode such that the generation of 2DEG directly beneath the gate electrode may be suppressed by holes supplied from the low resistance p-type GaN layer (e.g., Patent Document 2).

RELATED ART DOCUMENT

Patent Document 1: Japanese Laid-open Patent Publication No. 2002-359256
Patent Document 2: Japanese Laid-open Patent Publication No. 2010-135641
Non-patent Document 1: Journal of Crystal Growth 248 (2003) 513

However, it may be extremely difficult to reduce the thickness of the electron transit layer 913 while maintaining a desired crystallinity because the thinning of the electron transit layer 913 may increase on resistance. Further, when a p-Gan layer 931 doped with a p-type impurity element such as Mg is formed beneath the electron transit layer 913 as illustrated in FIG. 2, the Mg that has been doped in the p-GaN layer 931 may diffuse into the electron transit layer 913 owing to the diffusion susceptibility of Mg or the like into the GaN. Consequently, a Mg-diffusion region 913b is formed in the electron transit layer 913 due to the diffusion of Mg into the electron transit layer 913, which may degrade the characteristic of the HEMT due to the reduced concentration of 2DEG in the electron transit layer 913 or the lowered electron mobility. Note that FIG. 2 illustrates a state of the HEMT having GaN in which 2DEG is eliminated due to the diffusion of Mg into the electron transit layer 913.

Accordingly, it may be desirable to provide a fabrication method and a semiconductor device formed by utilizing a nitride semiconductor such as GaN or the like as a semiconductor material, which may be capable of exhibiting the normally-off status by suppressing the leakage current between the drain and the source.

SUMMARY

According to an aspect of the embodiments, there is provided a semiconductor device that includes a first semiconductor layer formed on a substrate, the first semiconductor containing an impurity element; a second semiconductor layer formed on the first semiconductor layer; a third semiconductor layer formed on the second semiconductor layer; and a gate electrode, a source electrode and a drain electrode that are formed on the third semiconductor layer. In the semiconductor device, the second semiconductor layer includes an impurity diffusion region in which an impurity element contained in the first semiconductor layer is diffused, the impurity diffusion region being located directly beneath the gate electrode and being in contact with the first semiconductor layer, and the impurity element causes the impurity diffusion region to be a p-type impurity diffusion region.

The object and advantages of the invention will be realized and attained by means of the elements and combinations particularly pointed out in the appended claims.

It is to be understood that both the foregoing general description and the following detailed description are exemplary and explanatory and are not restrictive of the invention.

Additional objects and advantages of the embodiments will be set forth in part in the description which follows, and in part will be obvious from the description, or may be learned by practice of the invention.

DESCRIPTION OF EMBODIMENTS

Figure 1:
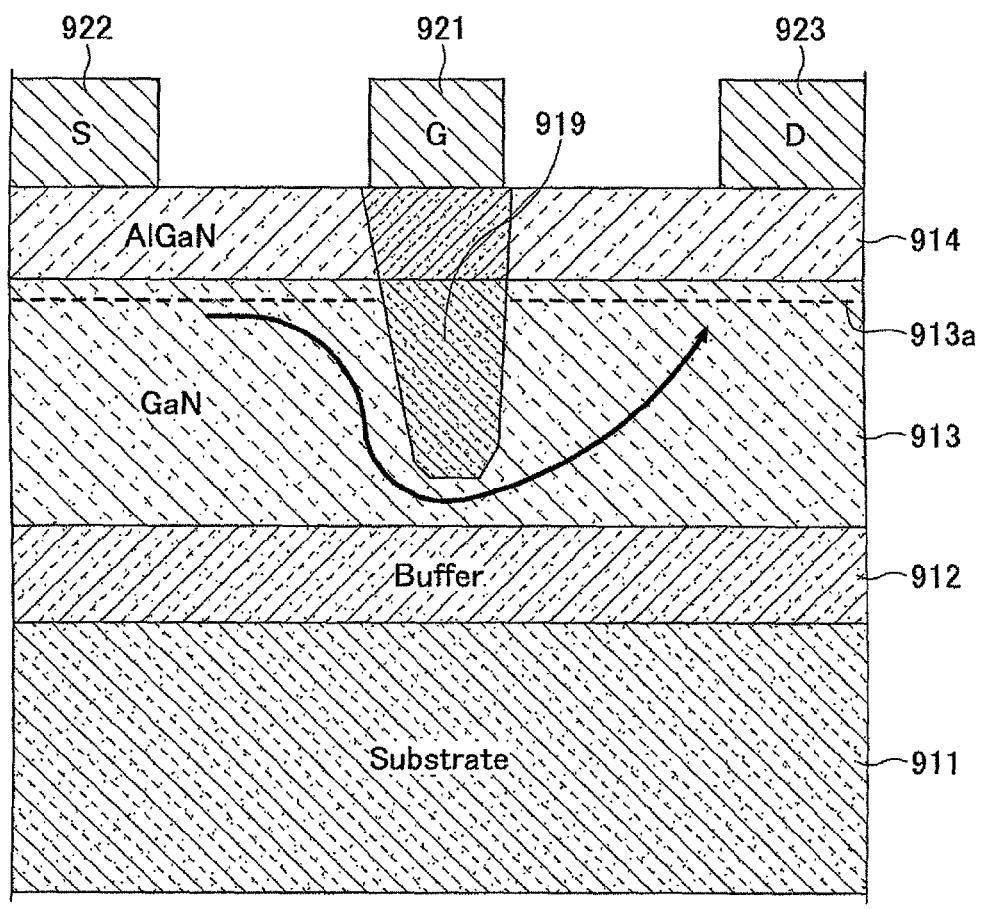
FIG. 1 is an explanatory diagram illustrating a related art high electron mobility transistor (HEMT) utilizing gallium nitride (GaN)
Figure 2:
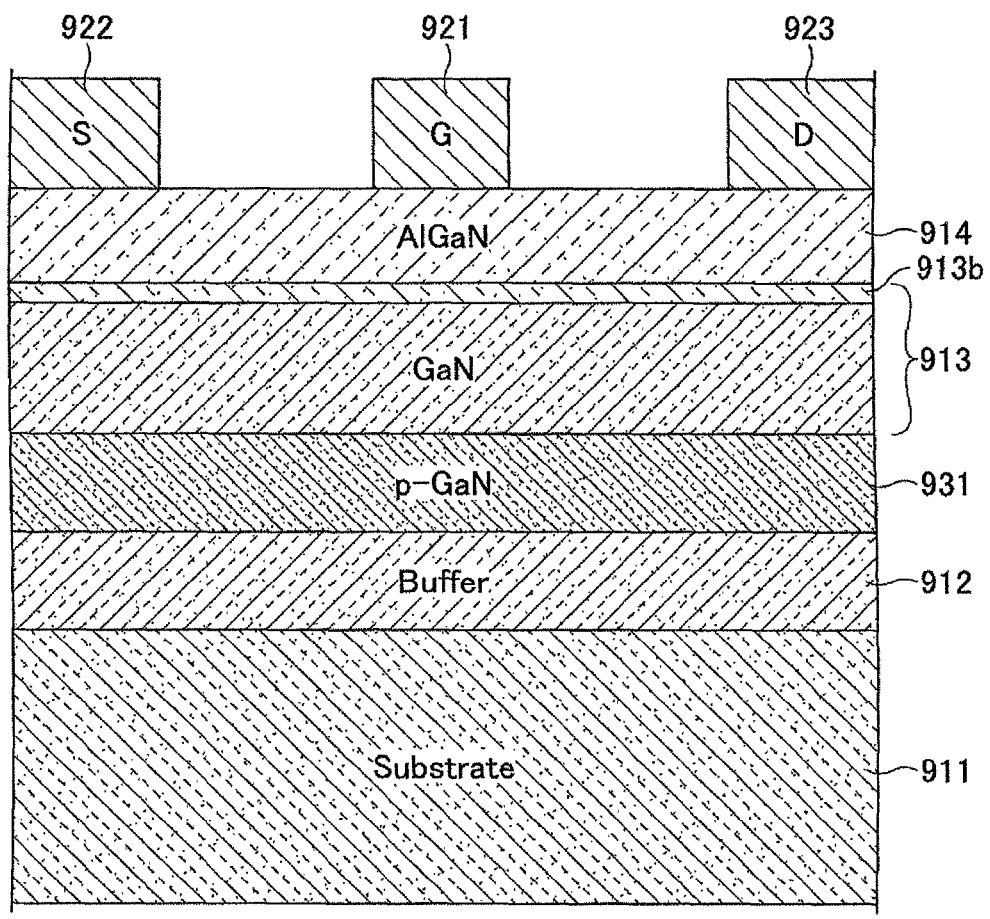
FIG. 2 is another explanatory diagram illustrating the related art high electron mobility transistor (HEMT) utilizing gallium nitride (GaN)
Figure 3:
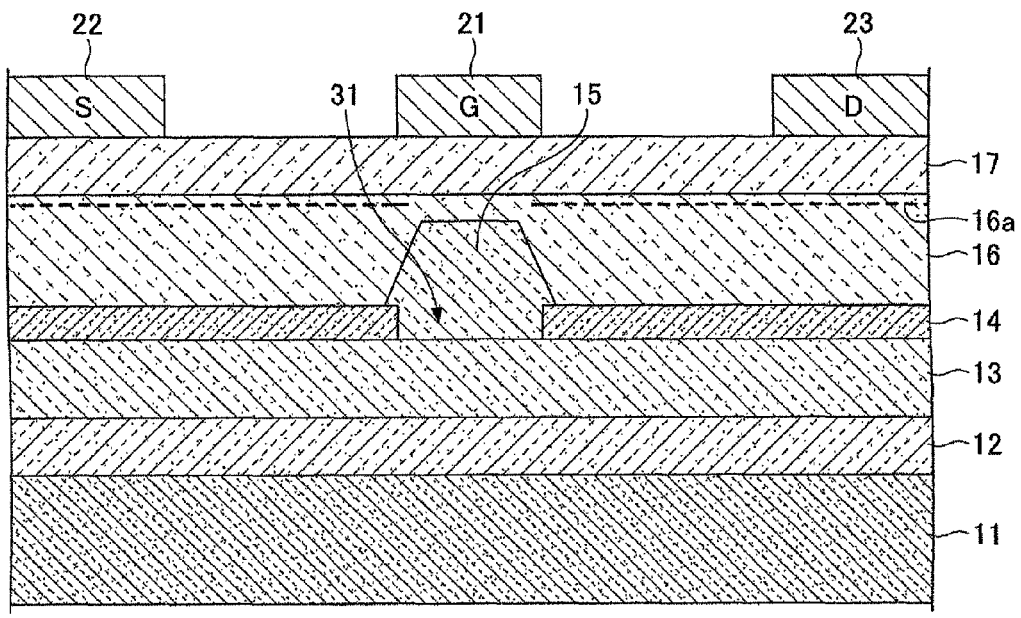
FIG. 3 is a structural diagram illustrating a semiconductor device according to a first embodiment.

In the following, preferred embodiments are described with reference to the accompanying drawings. Note that identical components are provided with the same reference numerals and repeated descriptions of the same components are omitted.

First Embodiment (Semiconductor Device)

First, a semiconductor device according to a first embodiment is described with reference to FIG. 1. The semiconductor device according to the first embodiment includes a buffer layer 12 formed of aluminum nitride (AlN) or the like and a p-type layer 13 serving as a first semiconductor layer that is doped with a p-type impurity element on a substrate 11 such as a Si substrate. The semiconductor device according to the first embodiment further includes a growth control layer 14 formed of AlN or the like on the p-type layer 13, the growth control layer 14 having an opening 31 directly beneath a gate electrode 21, and a p-type diffusion region 15 and an electron transit layer 16 that serve as a second semiconductor layer on the p-type layer 13 and the growth control layer 14. That is, the p-type diffusion region 15 is formed in a region of the p-type layer 13 exposed from the opening 31 of the growth control layer 14 located directly beneath the gate electrode 21 such that the electron transit layer 16 is formed in the p-type diffusion region 15 and on the growth control layer 14. Note that in the semiconductor device according to the first embodiment, "directly beneath the gate electrode 21" includes a region beneath an electron donation layer 17 and electron transit layer 16 via which the gate electrode 21 is formed. The semiconductor device according to the first embodiment further includes the electron donation layer 17 serving as a third semiconductor layer on the electron transit layer 16, and the gate electrode 21, a source electrode 22 and a drain electrode 23 on the electron donation layer 17. The electron transit layer 16 is formed of GaN, the electron donation layer 17 is formed of AlGaN. Hence, in the electron transit layer 16, a two-dimensional electron gas (2DEG) 16a is formed near an interface between the electron transit layer 16 and the electron donation layer 17. The p-type layer 13 is formed of GaN that is doped with Mg as a p-type impurity element. Hence, when GaN crystal is grown on the p-type layer 13, the p-type diffusion region 15 is formed by acquiring Mg contained in the p-type layer 13 via the opening 31 of the growth control layer 14 from which the p-type layer 13 is exposed. Hence, the p-type diffusion region 15 may also be called an "impurity diffusion region". Note that since the electron transit layer 16 is formed on the growth control layer 14, the electron transit layer 16 will not acquire Mg. Accordingly, the electron transit layer 16 is formed of GaN containing no Mg. Alternatively, the p-type layer 13 may be formed of AlGaN that is doped with a p-type impurity element.

Thus, the p-type diffusion region 15 is formed in a region of the p-type layer 13 directly beneath the gate electrode 21. With this configuration, few electrons may be present in the 2DEG 16a in a region directly above the p-type diffusion region 15, that is, in a region directly beneath the gate electrode 21. Hence, the semiconductor device according to the first embodiment may be able to exhibit a normally-off status. Further, since the resistance of the p-type diffusion region 15 is increased, the leakage current flowing from the drain electrode 23 to the source electrode 22 may be suppressed by forming the p-type diffusion region 15 in a layer lower than the electron transit layer 16 located directly beneath the gate electrode 21. Note that the growth control layer 14 may alternatively be formed of other nitrides such as AlGaN, InAlN, SiOx, and SiN.

(Fabrication Method of Semiconductor Device)

Next, a fabrication method of the semiconductor device according to the first embodiment is described with reference to FIGS. 4A to 6.

Figure 4A:
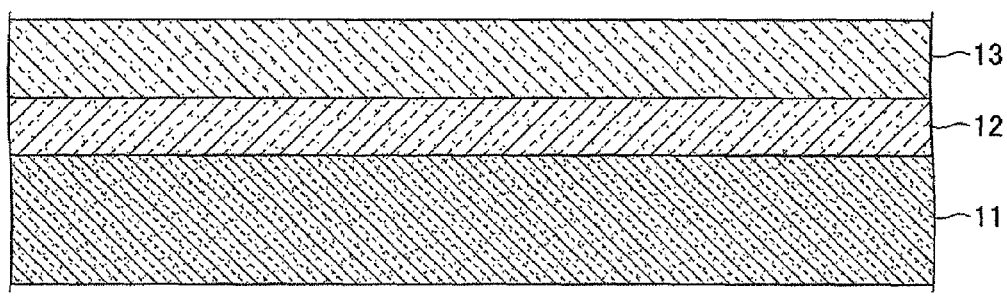
FIGS. 4A and 4B are first process diagrams illustrating a fabrication method of the semiconductor device according to the first embodiment.

Initially, the buffer layer 12 and the p-type layer 12 are epitaxially grown on the substrate 11 by metal organic vapor phase epitaxy (MOVPE) as illustrated in FIG. 4A. When the buffer layer 12 and the p-type layer 13 are epitaxially grown on the substrate 11 by MOVPE, trimethylaluminum (TMA) is utilized as a source gas of Al, trimethylgallium (TMG) is utilized as a source gas of Ga, and ammonia (NH3) is utilized as a source gas of N. Further, cyclopentadienylmagnesium ($Cp_2Mg$) is utilized as a source gas of Mg that is dopes as an impurity element. Note that these source gases are supplied with hydrogen ($H_2$) as a carrier gas to a fission reactor of an MOVPE device.

The substrate 11 is made of sapphire, silicon (Si), silicon carbide (SiC) or the like. It is preferable that the substrate 11 be made of a high resistance material having resistance sufficiently high enough to prevent the leakage current from leaking into the substrate 11. In this embodiment, the substrate 11 is made of Si.

The buffer layer 12 is formed after having heat-treated the substrate 11 under a hydrogen atmosphere for several minutes. The buffer layer 12 is formed by initially forming an AlN layer and subsequently forming an Al GaN layer. It is preferable that the buffer layer 12 be thicker in order to reduce the dislocation induced by the substrate 11. However, it is not preferable that the buffer layer 12 be formed too thick in order to prevent the buffer layer 12 from cracking. Thus, it is preferable that the thickness of the buffer layer 12 be in a range of 200 to 1000 nm. Alternatively, the buffer layer 12 may be a superlattice buffer having a periodical structure in which GaN and AlN are alternately formed, or the buffer layer 12 may have a composition graded structure in which the composition ratio of Al is changed from AlN to GaN. Note that the temperature at which the buffer layer 12 is formed may be approximately 1000° C.

The p-type layer 13 is formed on the buffer layer 12. The p-type layer 13 is formed of GaN that is doped with Mg as a p-type impurity element. The thickness of the p-type layer 13 is in a range of 100 to 300 nm. Note that doping of an excessive amount of Mg may result in degraded crystallinity in the p-type layer 13 and the electron transit layer 16 formed on the p-type layer 13. Hence, a preferable concentration of Mg to be doped may be in a range of $5\times10^{17}$ to $5\times10^{19}$ $cm^{-3}$. In this embodiment, Mg is doped at the concentration of $1\times10^{19}$ $cm^{-3}$. Further, Mg is utilized as the p-type impurity element in this embodiment; however, other impurity elements may alternatively utilized as the p-type impurity element insofar as the impurity element is a p-type.

Figure 4B:
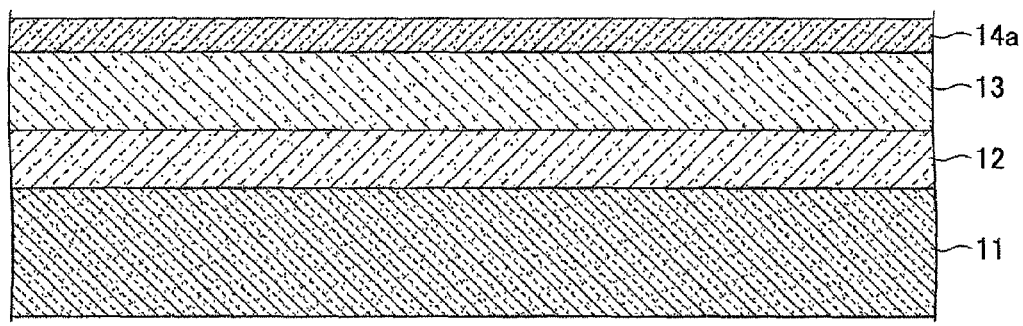

Next, an AlN film 14a for forming the growth control layer 14 is formed on the p-type layer 13 as illustrated in FIG. 4B. Specifically, the AlN film 14a is formed by MOVPE, sputtering or the like. The AlN film 14a is formed by MOVPE at a temperature range of 500 to 800° C. In general, the p-type layer 13, and the later-described electron transit layer 16 and the electron donation layer 17 are formed by MOVPE at approximately 1000° C. or higher. However, the AlN film 14a is formed at a temperature range lower than the temperature range for forming the p-type layer 13, and the electron transit layer 16 and the electron donation layer 17. Since the AlN film 14a is formed at a temperature lower than the normal deposition temperature range, the AlN film may particularly be called a "low temperature AlN" (LT-Al AlN). Since the AlN film 14a is formed at a low temperature, the obtained AlN film 14a is a polycrystalline film. Note that the obtained AlN film 14a may either be a polycrystalline film or an amorphous film. Note also that the thickness of the AlN film 14a is in a range of 5 to 50 nm.

Figure 5A:
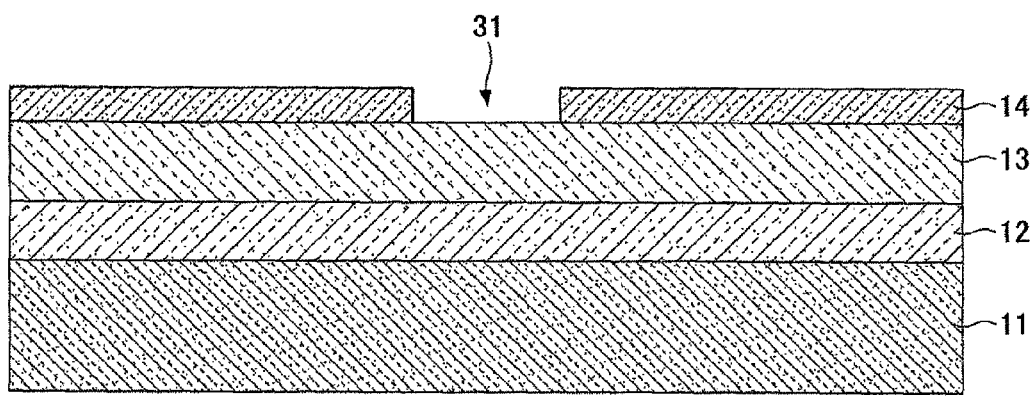
FIGS. 5A and 5B are second process diagrams illustrating the fabrication method of the semiconductor device according to the first embodiment.

Next, the growth control layer 14 is formed by forming the opening 31 in the AlN film 14a as illustrated in FIG. 5A. Specifically, a photoresist is applied to an entire surface of the AlN film 14a, and the photoresist applied AlN film 14a is then exposed to light for performing the development utilizing the exposure device, thereby forming a not-illustrated resist pattern having an opening corresponding to the opening 31. Thereafter, the AlN film 14a is removed by reactive ion etching (RIE) or the like from regions in which the resist pattern is not formed, and the resist pattern is subsequently removed with an organic solvent or the like. As a result, the growth control layer 14 formed of AlN may be formed.

Figure 5B:
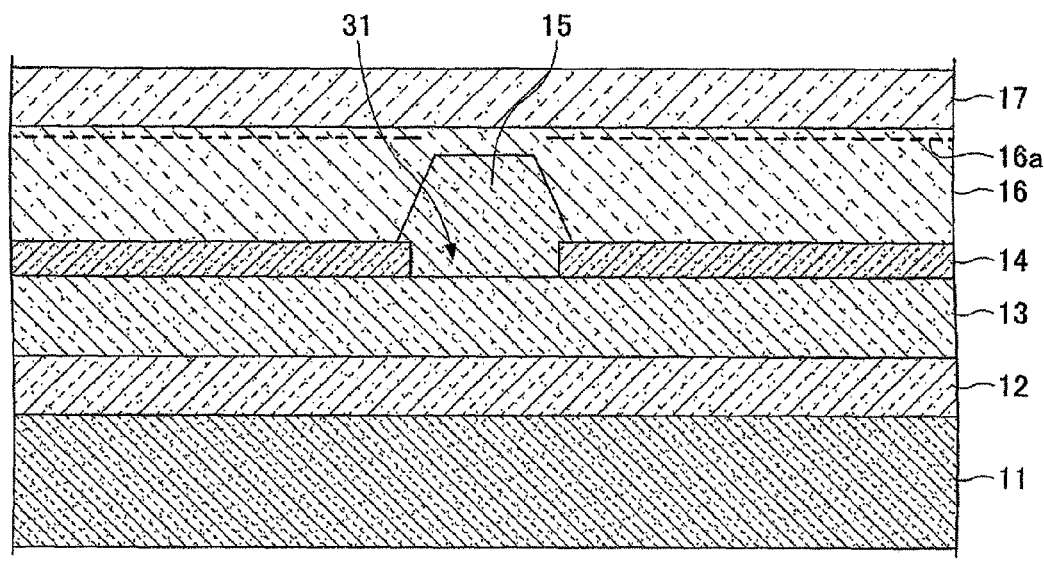

Next, as illustrated in FIG. 5B, the p-type diffusion region 15 and the electron transit layer 16 are formed by MOVPE on the growth control layer 14 formed side, and the electron donation layer 17 is further formed on the electron transit layer 16. The p-type diffusion region 15 and the electron transit layer 16 are both formed by growing GaN crystal. The GaN that forms the p-type diffusion region 15 and the electron transit layer 16 initially grows in the opening 31 from which the p-type layer 13 is exposed and in which the growth control layer 14 is unformed by acquiring Mg serving as an impurity element from the p-type layer 13. In general, the GaN is susceptible to growing in a two dimensional (2D) growth mode. Hence, the GaN may be grown thicker to acquire the flatter film of the GaN. However, since it is preferable that the p-type diffusion region 15 be formed only in a region in which the growth control layer 14 is unformed, the p-type diffusion region 15 is formed under a condition in which a three dimensional (3D) growth is dominant such as a high pressure condition. After having formed the p-type diffusion region 15 with a desirable thickness, the electron transit layer 16 is formed under a condition in which the GaN grows two-dimensionally. In this case, the thickness range of the electron transit layer 16 may be 500 to 1000 nm in order to avoid the reduction in electron density or the reduction in the electron mobility in the 2DEG 16a induced by the dislocation. Accordingly, the p-type diffusion region 15 is formed in the region of the p-type layer 13 exposed from the opening 31 of the growth control layer 14 located directly beneath the gate electrode 21 such that the electron transit layer 16 formed of GaN is formed in the p-type diffusion region 15 and on the growth control layer 14. Note that in this embodiment, the p-type diffusion region 15 is formed such that the interface between the p-type diffusion region 15 and a surface of the electron transit layer 16 is located several hundred nm beneath a surface of the electron transit layer 16. Further, the growth control layer 14 may also serve as a layer for preventing the aforementioned diffusion of the Mg as well as serving as a growth nucleus forming layer for forming the electron transit layer 16 on the growth control layer 14.

Subsequently, the electron donation layer 17 is formed on the electron transit layer 16. Note that the electron donation layer 17 is formed such that the thickness of the AlGaN is approximately 20 nm. When the electron donation layer 17 is expressed as $Al_xGa_{1-x}N$, the electron donation layer 15 is formed such that the X value is less than or equal to 0.3 in order to prevent the degradation of crystallinity caused by lattice mismatch.

Figure 6:
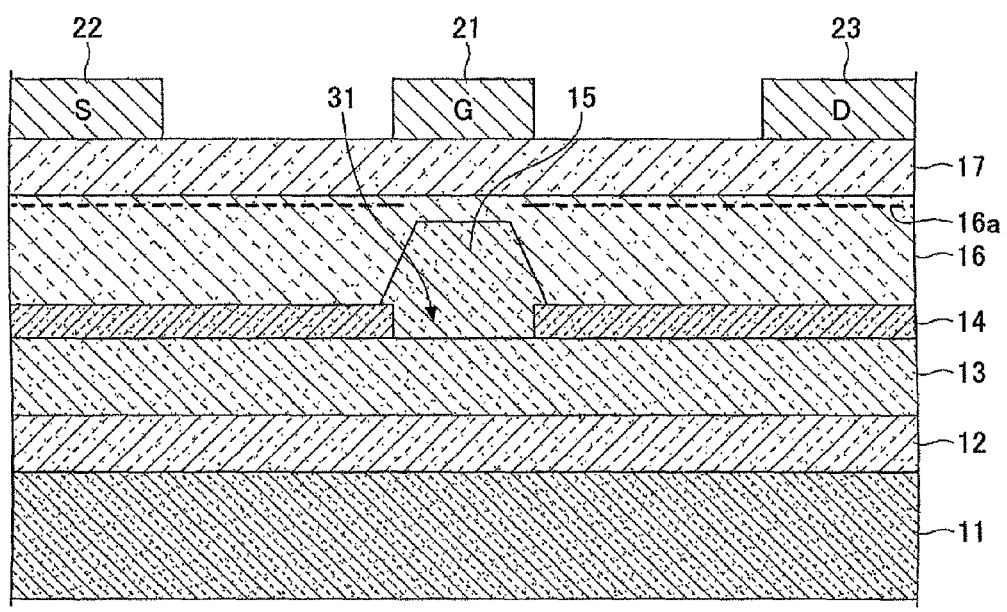
FIG. 6 is a third process diagram illustrating the fabrication method of the semiconductor device according to the first embodiment.

Next, the gate electrode 21, the source electrode 22 and the drain electrode 23 are formed on the electron donation layer 17 as illustrated in FIG. 6. Specifically, a photoresist is applied to the electron donation layer 17, and the photoresist applied electron donation layer 17 is then exposed to light for performing the development utilizing an exposure device, thereby forming a not-illustrated resist pattern having openings corresponding to regions in which the source electrode 22 and the drain electrode 23 are formed. Thereafter, a metallic film is deposited on the resist pattern by a deposition process such as vacuum deposition. Subsequently, the metallic film deposited on the resist pattern is impregnated with an organic solvent or the like so as to remove the metallic film together with the resist pattern. As a result, the source electrode 22 and the drain electrode 23 are formed. Subsequently, a photoresist is applied to the electron donation layer 17 again, and the photoresist applied electron donation layer 17 is then exposed to light for the development utilizing the exposure device, thereby forming a not-illustrated resist pattern having an opening corresponding to a region in which the gate electrode 21 is formed. Thereafter, a metallic film is deposited on the resist pattern by the deposition process such as vacuum deposition. Subsequently, the metallic film deposited on the resist pattern is impregnated with an organic solvent or the like so as to remove the metallic film together with the resist pattern. As a result, the gate electrode 21 is formed.

Accordingly, the HEMT having the GaN serving as the semiconductor device according to the first embodiment is fabricated in the above-described manner.

Second Embodiment (Semiconductor Device)

Figure 7:
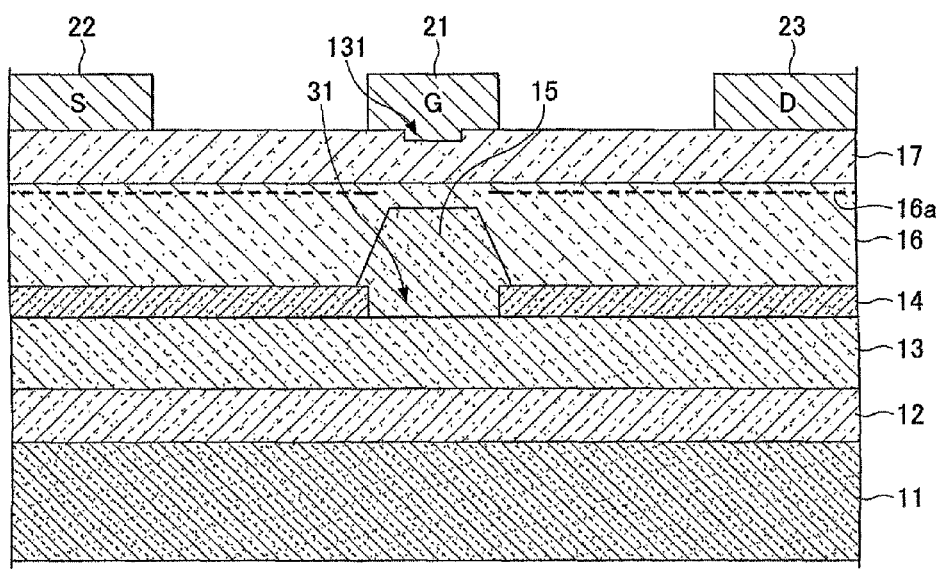
FIG. 7 is a structural diagram illustrating a semiconductor device according to a second embodiment.

Next, a semiconductor device according to a second embodiment is described with reference to FIG. 7. The semiconductor device according to the second embodiment includes a structure in which a gate recess is formed near a gate electrode.

Specifically, the semiconductor device according to the second embodiment includes a buffer layer 12 formed of aluminum nitride (AlN) or the like and a p-type layer 13 serving as a first semiconductor layer that is doped with a p-type impurity element on a substrate 11 such as a Si substrate. The semiconductor device according to the second embodiment further includes a growth control layer 14 formed of AlN or the like on the p-type layer 13, the growth control layer 14 having an opening 31 directly beneath a gate electrode 21, and a p-type diffusion region 15 and an electron transit layer 16 that serve as a second semiconductor layer on the p-type layer 13 and the growth control layer 14. That is, the p-type diffusion region 15 is formed in a region of the p-type layer 13 exposed from the opening 31 of the growth control layer 14 located directly beneath the gate electrode 21 such that the electron transit layer 16 is formed in the p-type diffusion region 15 and on the growth control layer 14. The semiconductor device according to the second embodiment further includes the electron donation layer 17 serving as a third semiconductor layer on the electron transit layer 16 and a concave-shaped gate recess 131 in a region of a surface of the electron donation layer 17 in which the gate electrode 21 is formed. The gate electrode 21 is formed on the electron donation layer 17 and including an internal area of the gate recess 131 of the electron donation layer 17. The source electrode 22 and the drain electrode 23 are formed on the electron donation layer 17. The electron transit layer 16 is formed of GaN, the electron donation layer 17 is formed of AlGaN. Hence, in the electron transit layer 16, a two-dimensional electron gas (2DEG) 16a is formed near an interface between the electron transit layer 16 and the electron donation layer 17. The p-type layer 13 is formed of GaN that is doped with Mg as a p-type impurity element. Hence, when GaN crystal is grown on the p-type layer 13, the p-type diffusion region 15 is formed by acquiring Mg contained in the p-type layer 13 via the opening 31 of the growth control layer 14 from which the p-type layer 13 is exposed. Hence, the p-type diffusion region 15 may also be called an "impurity diffusion region". Note that since the electron transit layer 16 is formed on the growth control layer 14, the electron transit layer 16 will not acquire Mg. Accordingly, the electron transit layer 16 is formed of GaN containing no Mg.

Thus, the p-type diffusion region 15 is formed in a region of the p-type layer 13 directly beneath the gate electrode 21. With this configuration, few electrons may be present in the 2DEG 16a in a region directly above the p-type diffusion region 15, that is, in a region directly beneath the gate electrode 21. Hence, the semiconductor device according to the second embodiment may be able to exhibit a normally-off status. Further, the semiconductor device according to the second embodiment includes the gate recess 131, and hence, the semiconductor device according to the second embodiment is more likely to maintain the normally-off status. Further, since the resistance of the p-type diffusion region 15 is increased, the leakage current flowing from the drain electrode 23 to the source electrode 22 may be suppressed by forming the p-type diffusion region 15 in a layer lower than the electron transit layer 16 located directly beneath the gate electrode 21.

(Fabrication Method of Semiconductor Device)

Next, a fabrication method of the semiconductor device according to the second embodiment is described. The fabrication method of the semiconductor device according to the second embodiment includes forming the gate recess 131 after having carried out steps illustrated in FIGS. 4A to 5B for forming the semiconductor device according to the first embodiment.

Figure 8A:
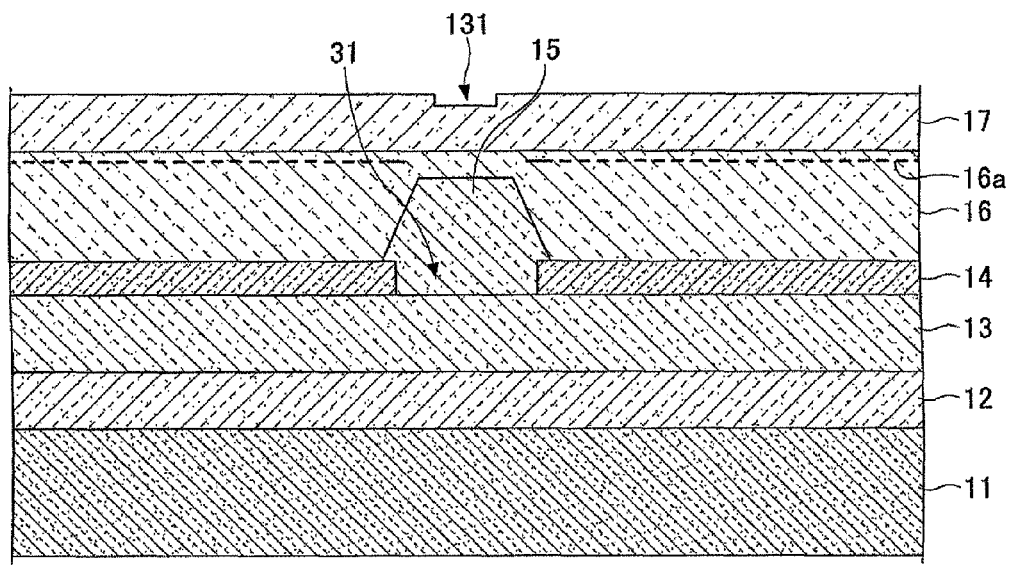
FIGS. 8A and 8B are explanatory diagrams illustrating the fabrication method of the semiconductor device according to the second embodiment.

Specifically, after having carried out similar steps illustrated in FIGS. 4A to 5B of the method for fabricating the semiconductor device according to the first embodiment to form a product obtained in FIG. 5B, the concave-shaped gate recess 131 is formed in the surface of the electron donation layer 17 as illustrated in FIG. 8A. The gate recess 131 is formed in the region of the surface of the electron donation layer 17 in which the gate electrode 21 is formed. Subsequently, a photoresist is applied to the electron donation layer 17, and the photoresist applied electron donation layer 17 is then exposed to light for the development utilizing the exposure device, thereby forming a not-illustrated resist pattern having an opening corresponding to a region in which the concave-shaped gate recess 131 is formed. Thereafter, the electron donation layer 17 is removed by reactive ion etching (RIE) or the like from regions in which the resist pattern is not formed. Thereafter, the resist pattern is removed with an organic solvent or the like.

Figure 8B:
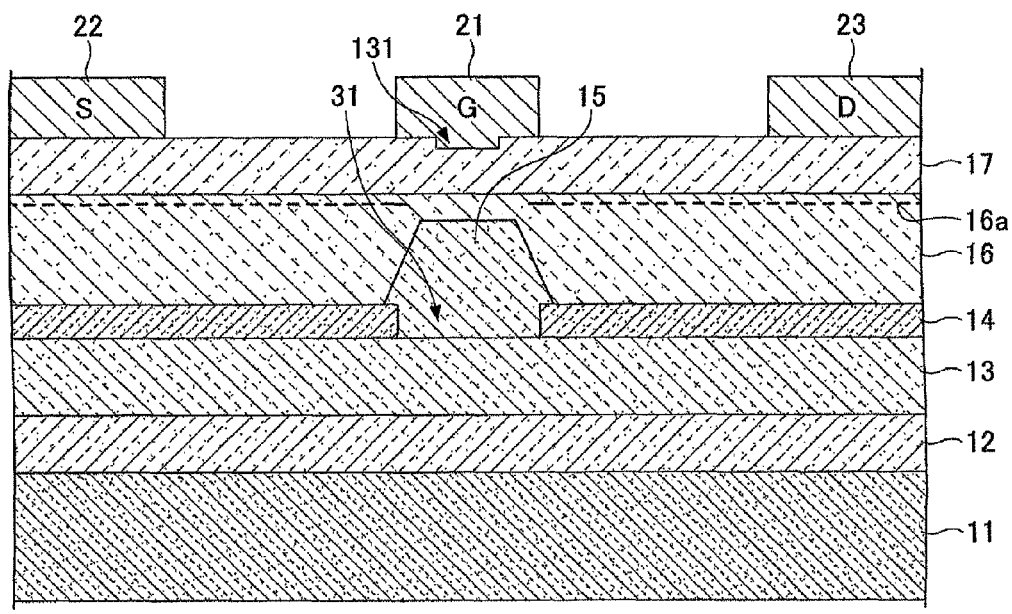

Next, the gate electrode 21, the source electrode 22 and the drain electrode 23 are formed on the electron donation layer 17 as illustrated in FIG. 8B. Specifically, a photoresist is applied to the electron donation layer 17, and the photoresist applied electron donation layer 17 is then exposed to light for performing the development utilizing an exposure device, thereby forming a not-illustrated resist pattern having openings corresponding to regions in which the source electrode 22 and the drain electrode 23 are formed. Thereafter, a metallic film is deposited on the resist pattern by the deposition process such as vacuum deposition. Subsequently, the metallic film deposited on the resist pattern is impregnated with an organic solvent or the like so as to remove the metallic film together with the resist pattern. As a result, the source electrode 22 and the drain electrode 23 are formed. Subsequently, a photoresist is applied to the electron donation layer 17 again, and the photoresist applied electron donation layer 17 is then exposed to light for the development utilizing the exposure device, thereby forming a not-illustrated resist pattern having an opening corresponding to a region in which the gate electrode 21 is formed. In this case, the gate electrode 21 is formed in an internal area or the like of the gate recess 131 formed in the surface of the electron donation layer 17 by adjusting the position of the gate electrode 21 such that the position of the gate electrode 21 matches the position of the gate recess 131. That is, the resist pattern having the opening is formed on the surface of the electron donation layer 17 such that the gate recess 131 is exposed from the opening of the resist pattern in which the gate electrode 21 is formed. Thereafter, a metallic film is deposited on the resist pattern by the deposition process such as vacuum deposition. Subsequently, the metallic film deposited on the resist pattern is impregnated with an organic solvent or the like so as to remove the metallic film together with the resist pattern. As a result, the gate electrode 21 is formed.

Accordingly, the HEMT having the GaN serving as the semiconductor device according to the second embodiment is fabricated in the above-described manner. Note that other features of the semiconductor device according to the second embodiment are similar to those of the semiconductor device according to the first embodiment.

Third Embodiment

Figure 9:
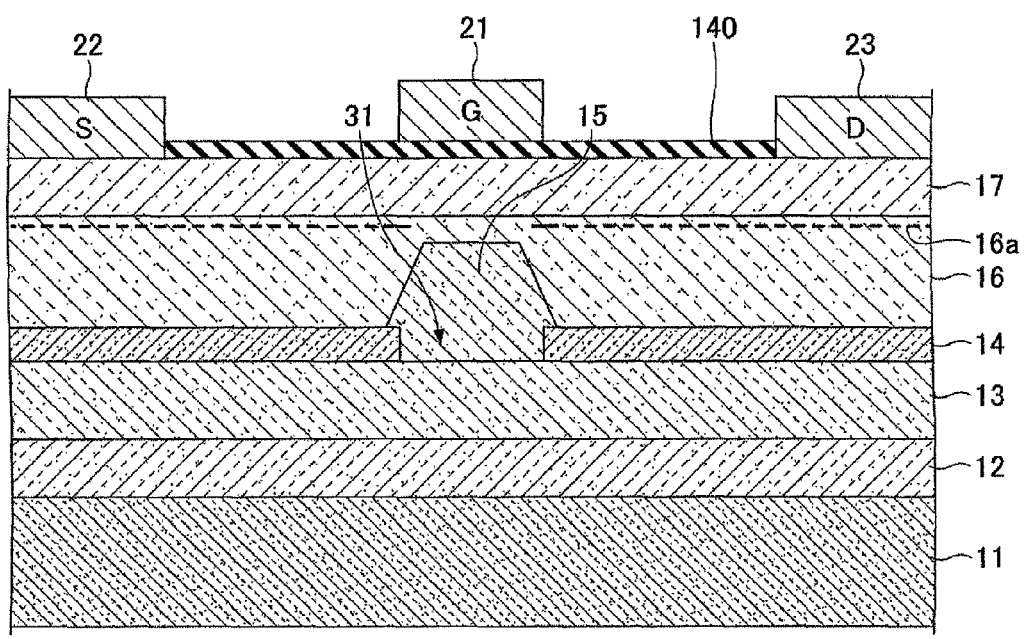
FIG. 9 is a structural diagram illustrating a semiconductor device according to a third embodiment.

Next, a semiconductor device according to a third embodiment is described with reference to FIG. 9. The semiconductor device according to the third embodiment includes a structure in which an insulating film 140 is formed on the electron donation layer 17. The semiconductor device having such an insulating film 140 may enable reducing the gate leakage current. The insulating film 140 may be formed of aluminum oxide ($Al_2O_3$) or the like.

The fabrication method of the semiconductor device according to the third embodiment includes forming the source electrode 22 and the drain electrode 23 on the electron donation layer 17 obtained by carrying out steps illustrated in FIGS. 4A to 5B for forming the semiconductor device according to the first embodiment, and thereafter forming the insulating film 140 serving as a gate insulating film. The insulator film 140 may be deposited by a chemical vapor deposition (CVD) process, anatomic layer deposition (ALD) process or a sputtering process.

Thereafter, the gate electrode 21 is formed in a predetermined region of the insulating film 140. That is, the gate electrode 21 is formed on the insulating film 140 in a region in which the p-type diffusion region 15 is formed.

The semiconductor device according to the third embodiment is thus formed in the above-described manner.

Note that other features of the semiconductor device according to the third embodiment are similar to those of the semiconductor device according to the first embodiment. Further, the semiconductor device according to the third embodiment may also be applicable to the semiconductor device according to a second embodiment.

Fourth Embodiment

Next, a fourth embodiment is described. The fourth embodiment describes a semiconductor package, a power supply unit and a high-frequency amplifier.

Figure 10:
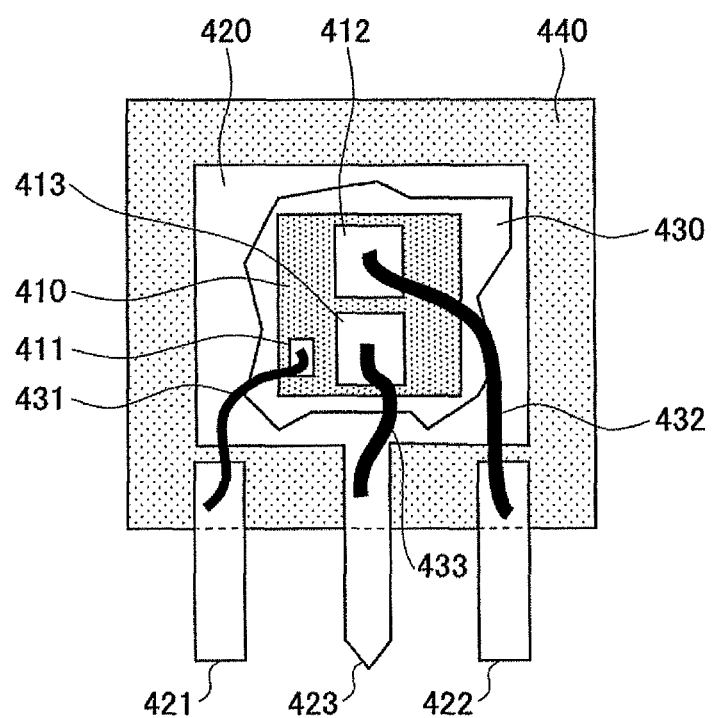
FIG. 10 is an explanatory diagram illustrating a discrete semiconductor package according to a fourth embodiment.

The semiconductor package according to the fourth embodiment includes a discrete package of the semiconductor device according to one of one of the first embodiment to the third embodiment, which is hereinafter called a "discrete semiconductor package", and the discrete semiconductor package according to the fourth embodiment is described with reference to FIG. 10. Note that FIG. 10 schematically illustrates an internal configuration of the discrete semiconductor package. Hence, arrangement of the electrode or the like in the configuration of the discrete semiconductor package may differ from those of the semiconductor device according to one of the first embodiment to the third embodiment.

Initially, a high electron mobility transistor (HEMT) semiconductor chip 410 made of a GaN semiconductor material may be formed by dicing the semiconductor device fabricated in one of the first embodiment to the third embodiment. The semiconductor chip 410 is fixed onto a lead frame 420 with a die-attach adhesive 430 such as solder. Note that the semiconductor chip 410 corresponds to the semiconductor device according to one of the first embodiment to the third embodiment.

Subsequently, a gate electrode 411 is connected to a gate lead 421 with a bonding wire 431. A source electrode 412 is connected to a source lead 422 with a bonding wire 432. A drain electrode 413 is connected to a drain lead 423 with a bonding wire 433. Note that the bonding wires 431, 432 and 433 are formed of a metallic material such as aluminum (Al). Further, in the semiconductor package according to the fourth embodiment, the gate electrode 411 is a gate electrode pad, which is connected to the gate electrode 21 of the semiconductor device according to one of the first embodiment to the third embodiment. Further, the source electrode 412 is a source electrode pad, which is connected to the source electrode 22 of the semiconductor device according to one of the first embodiment to the third embodiment. In addition, the drain electrode 413 is a drain electrode pad, which is connected to the drain electrode 23 of the semiconductor device according to one of the first embodiment to the third embodiment.

Subsequently, the obtained product is sealed by plastic molding such as transfer molding with mold resin 440. Accordingly, the discrete HEMT semiconductor package utilizing the GaN semiconductor material is thus fabricated.

Next, a power supply unit and a high-frequency amplifier according to the third embodiment are described. The power supply unit and the high-frequency amplifier in the fourth embodiment may be formed by utilizing any one of the semiconductor devices according to the first embodiment to the third embodiment.

Figure 11:
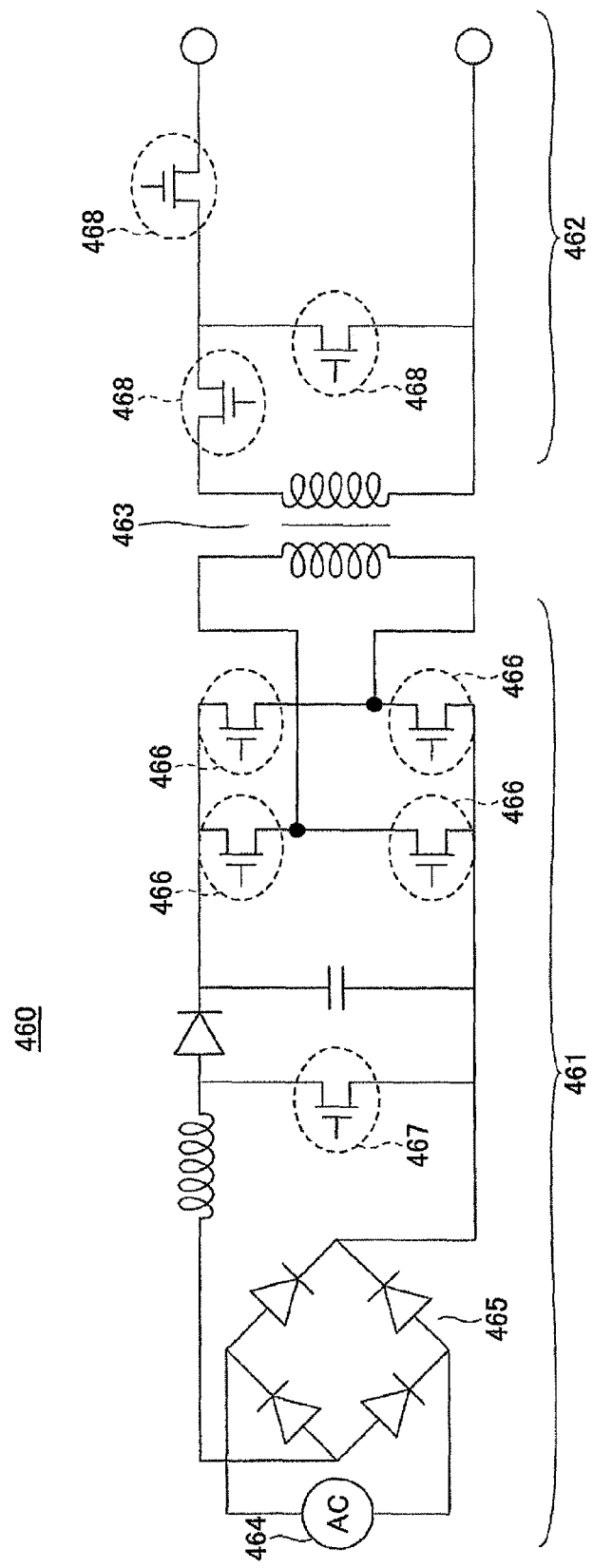
FIG. 11 is a circuit diagram of a power supply unit according to the fourth embodiment.

Initially, the power supply unit in the fourth embodiment is described with reference to FIG. 11. The power supply unit 460 in the fourth embodiment includes a high-voltage primary circuit 461, a low-voltage secondary circuit 462 and a transformer 463 that is arranged between the primary circuit 461 and the secondary circuit 462. The primary circuit 461 includes an alternating-current (AC) power supply 464, a so-called "bridge rectifier circuit" 465, plural switching elements (four switching elements in the example of FIG. 11) 466 and a switching element 467. The secondary circuit 462 includes plural switching elements (three switching elements in the example of FIG. 11) 468. In the example of FIG. 11, the semiconductor device according to one of the first embodiment to the third embodiment serves as the switching elements 466 and the switching element 467 of the primary circuit 461. Note that it is preferable that the switching elements 466 and the switching element 467 of the primary circuit 461 be normally-off semiconductor devices. Further, the switching elements utilized in the secondary circuit 462 employs an ordinary metal insulator semiconductor field-effect transistor (MISFET) formed of silicon.

Figure 12:
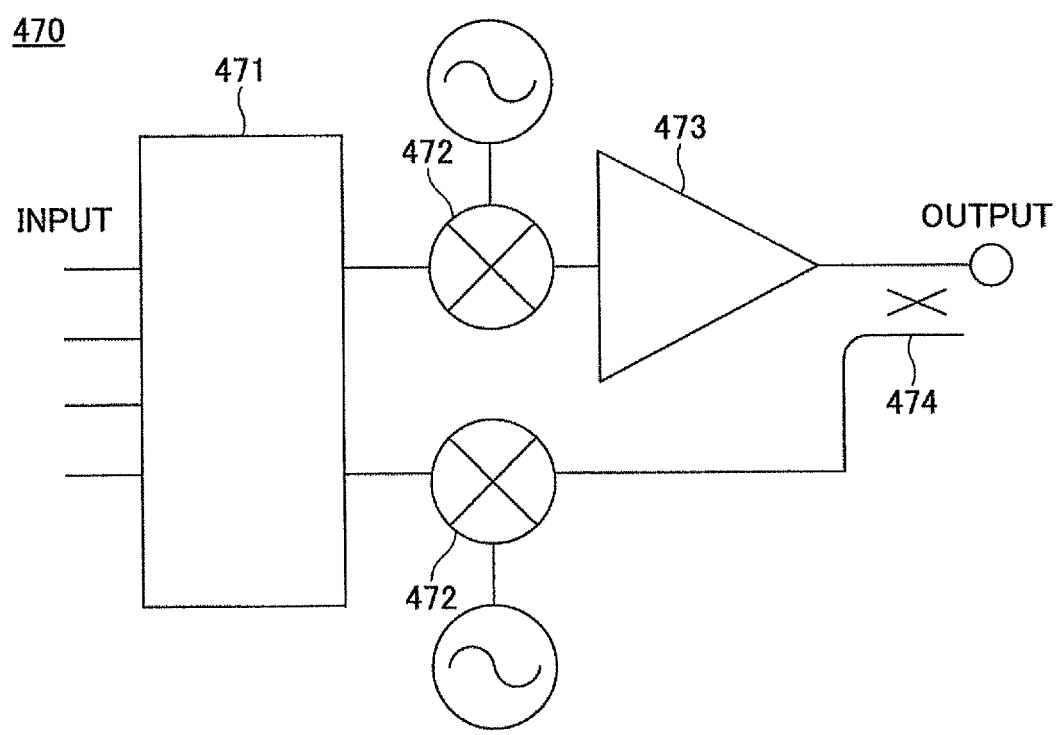
FIG. 12 is a structural diagram illustrating a high-power amplifier according to the fourth embodiment.

Next, the high-frequency amplifier in the fourth embodiment is described with reference to FIG. 12. The high-frequency amplifier 470 in the fourth embodiment may be applied as a power amplifier of a mobile phone base station. The high-frequency amplifier 470 includes a digital predistortion circuit 471, a mixer 472, a power amplifier 473 and a directional coupler 474. The digital predistortion circuit 471 is configured to compensate non-linear strain of an input signal.

The mixer 472 is configured to mix the input signal of which the non-linear strain is compensated with an alternating current (AC) signal.

The power amplifier 473 is configured to amplify the input signal mixed with the AC signal. In the example of FIG. 12, the power amplifier 473 includes the semiconductor device according to one of the first embodiment to the third embodiment. The directional coupler 474 is configured to monitor the input signal or output signal. In the circuit illustrated in FIG. 12, the mixer 472 may mix the output signal with the AC signal and supply the mixed signal of the output signal and the AC signal to the digital predistortion circuit 471.

According to the disclosed embodiments, the fabrication method and the semiconductor device may be formed by utilizing a nitride semiconductor such as GaN or the like as a semiconductor material, which may be capable of exhibiting the normally-off status by suppressing the leakage current between the drain and the source.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
    a first semiconductor layer formed on a substrate, the first semiconductor containing an impurity element;
    a second semiconductor layer formed on the first semiconductor layer;
    a third semiconductor layer formed on the second semiconductor layer; and
    a gate electrode, a source electrode and a drain electrode that are formed on the third semiconductor layer, wherein
    the second semiconductor layer includes an impurity diffusion region in which an impurity element contained in the first semiconductor layer is diffused, the impurity diffusion region being located directly beneath the gate electrode and being in contact with the first semiconductor layer, wherein
    the impurity element causes the impurity diffusion region to be a p-type impurity diffusion region; and
    a growth control layer between the first semiconductor layer and the second semiconductor layer, the growth control layer having an opening located directly beneath a region in which the gate electrode is formed.

2. The semiconductor device as claimed in claim 1, wherein
    the growth control layer is formed of a material containing any one of aluminum nitride (AlN), aluminum gallium nitride (AlGaN), indium aluminum nitride (InAlN), silicon oxide ($SiO_x$) and silicon nitride (SiN).

3. The semiconductor device as claimed in claim 1, wherein
    the growth control layer is polycrystalline or amorphous.

4. The semiconductor device as claimed in claim 1, wherein
    a thickness of the growth control layer is in a range of 5 to 50 nm.

5. The semiconductor device as claimed in claim 1, wherein
    the third semiconductor layer includes a concave-shaped gate recess in a region in which the gate electrode is formed, and the gate electrode is formed in the region including an internal area of the concave-shaped gate recess.

* * * * *

UNITED STATES PATENT AND TRADEMARK OFFICE
CERTIFICATE OF CORRECTION

PATENT NO. : 8,878,248 B2  
APPLICATION NO. : 13/544023  
DATED : November 4, 2014  
INVENTOR(S) : Tetsuro Ishiguro and Atsushi Yamada Page 1 of 1

It is certified that error appears in the above-identified patent and that said Letters Patent is hereby corrected as shown below:

On the Title Page, Item (73) (Assignee): Please delete "Yokoham" and insert --Yokohama--

Signed and Sealed this  
Third Day of March, 2015

Michelle K. Lee  
*Deputy Director of the United States Patent and Trademark Office*